United States Patent
Gandhi

(10) Patent No.: US 8,962,449 B1
(45) Date of Patent: Feb. 24, 2015

(54) METHODS FOR PROCESSING SEMICONDUCTOR DEVICES

(71) Applicant: Micron Technology, Inc., Boise, ID (US)

(72) Inventor: Jaspreet S. Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/954,133

(22) Filed: Jul. 30, 2013

(51) Int. Cl.
   *H01L 21/22* (2006.01)
   *H01L 21/38* (2006.01)
   *H01L 21/762* (2006.01)
   *H01L 29/02* (2006.01)

(52) U.S. Cl.
   CPC .......... *H01L 21/76254* (2013.01); *H01L 29/02* (2013.01)
   USPC .................... 438/455; 438/458; 257/E21.122

(58) Field of Classification Search
   USPC .................... 438/455, 457, 458; 257/E21.122
   See application file for complete search history.

(56) References Cited

U.S. PATENT DOCUMENTS

| | | | |
|---|---|---|---|
| 7,173,369 B2 | 2/2007 | Forrest et al. | |
| 7,635,617 B2 * | 12/2009 | Yamazaki | 438/149 |
| 7,910,283 B2 | 3/2011 | Ogihara et al. | |
| 7,935,780 B2 | 5/2011 | Hong et al. | |
| 2005/0000636 A1 | 1/2005 | Geiger et al. | |
| 2006/0205907 A1 | 9/2006 | Guyer | |
| 2007/0056469 A1 | 3/2007 | van Ooij et al. | |
| 2007/0141365 A1 | 6/2007 | Jelle et al. | |
| 2007/0155129 A1 | 7/2007 | Thallner | |
| 2009/0218560 A1 | 9/2009 | Flaim et al. | |
| 2010/0242958 A1 | 9/2010 | Jinks et al. | |
| 2011/0308739 A1 | 12/2011 | McCutcheon et al. | |
| 2012/0248614 A1 | 10/2012 | Gandhi et al. | |
| 2013/0061869 A1 | 3/2013 | McCutcheon et al. | |

OTHER PUBLICATIONS

Flaim, Tony D., Advancements in Thin-Wafer Handling, Brewer Science, European TSV Summit—Jan. 22-23, 2013, 17 pages.

(Continued)

*Primary Examiner* — Hoai V Pham
(74) *Attorney, Agent, or Firm* — TraskBritt

(57) ABSTRACT

Methods of forming a semiconductor structure include exposing a carrier substrate to a silane material to form a coating, removing a portion of the coating at least adjacent a periphery of the carrier substrate, adhesively bonding another substrate to the carrier substrate, and separating the another substrate from the carrier substrate. The silane material includes a compound having a structure of $(XO)_3Si(CH_2)_nY$, $(XO)_2Si((CH_2)_nY)_2$, or $(XO)_3Si(CH_2)_nY(CH_2)_nSi(XO)_3$, wherein XO is a hydrolyzable alkoxy group, Y is an organo-functional group, and n is a nonnegative integer. Some methods include forming a polymeric material comprising Si—O—Si over a first substrate, removing a portion of the polymeric material, and adhesively bonding another substrate to the first substrate. Structures include a polymeric material comprising Si—O—Si disposed over a first substrate, an adhesive material disposed over the first substrate and at least a portion of the polymeric material, and a second substrate disposed over the adhesive material.

22 Claims, 6 Drawing Sheets

(56) References Cited

OTHER PUBLICATIONS

Gandhi, Jaspreet S., Electrodeposition of Organofunctional Ssilanes for Improved Corrosion Protection of Metals, A dissertation submitted to the Division of Research and Advanced Studies of the University of Cincinnati dated Oct. 14, 2004, 232 pages.

PCT International Search Report of the International Searching Authority for PCT/US2014/047426, dated Nov. 28, 2014, 3 pages.
PCT Written Opinion of the International Searching Authority for PCT/US2014/047426, dated Nov. 28, 2014, 6 pages.

* cited by examiner

METHODS FOR PROCESSING SEMICONDUCTOR DEVICES

TECHNICAL FIELD

The present disclosure, in various embodiments, relates generally to compositions including a silane material and related methods, such as for removably bonding wafer substrates to carrier substrates using the compositions during processing of a semiconductor device.

BACKGROUND

Semiconductor devices and structures thereof are typically produced on a wafer or other bulk semiconductor substrate, which may be referred to herein as a "device wafer." The array is then "singulated" into individual semiconductor devices, which may also be characterized as "dice" that are incorporated into a package for practical mechanical and electrical interfacing with higher level packaging, for example, for interconnection with a printed wiring board. Device packaging may be formed on or around the die while it is still part of the wafer. This practice, referred to in the art as wafer-level packaging, reduces overall packaging costs and enables reduction of device size, which may result in faster operation and reduced power demand in comparison to than conventionally packaged devices.

Thinning device wafer substrates is commonly used in semiconductor device manufacture because thinning enables devices to be stacked and helps dissipate heat. However, thinner substrates are relatively more difficult to handle without damage to the substrate or to the integrated circuit components thereon. To alleviate some of the difficulties, device wafer substrates are commonly attached to larger and more-robust carrier wafers. After processing, the device wafer substrates may be removed from the carrier wafers.

Common carrier materials include silicon (e.g., a blank device wafer), soda-lime glass, borosilicate glass, sapphire, and various metals and ceramics. The carrier wafers are commonly substantially round and sized to match a size of the device wafer, so that the bonded assembly can be handled in conventional processing tools. Polymeric adhesives used for temporary wafer bonding are conventionally applied by spin coating or spray coating from solution or laminating as dry-film tapes. Spin- and spray-applied adhesives are increasingly preferred because they form coatings with higher thickness uniformity than tapes can provide. Higher thickness uniformity translates into greater control over cross-wafer thickness uniformity after thinning. The polymeric adhesives also exhibit high bonding strength to the device wafer and the carrier.

The polymeric adhesive may be spin-applied onto the device wafer, the carrier wafer, or both. The coated wafer is baked to remove all of the coating solvent from the polymeric adhesive. The coated device wafer and carrier wafer are then placed in contact in a heated mechanical press for bonding. Sufficient temperature and pressure are applied to cause the adhesive to flow and fill into the device wafer structural features and achieve intimate contact with all areas of the device wafer and carrier wafer surfaces.

Removal of a device wafer from the carrier wafer after processing is conventionally performed by chemical means (e.g., with a solvent), photodecomposition, thermomechanical means, or thermodecomposition. Each of these methods has drawbacks in production environments. For example, chemical debonding by dissolving the polymeric adhesive is a slow process because the solvent must diffuse over large distances through the viscous polymer medium to effect release. That is, the solvent must diffuse from the edge of the bonded substrates, or from a perforation in the carrier wafer, into the local region of the adhesive. In either case, the minimum distance from an exposed surface to a bonded area required for solvent diffusion and penetration is typically at least 3-5 mm and can be much greater, even with perforations to increase solvent contact with the adhesive. Treatment times of several hours, even at elevated temperatures (e.g., greater than 60° C.), are usually utilized for debonding to occur, meaning wafer throughput will be low.

Photodecomposition is, likewise, a slow process because the entire bonded substrate cannot generally be exposed at one time. Instead, the exposing light source, such as a laser having a beam cross-section of only a few millimeters, is focused on a small area at a time to deliver sufficient energy to decompose the adhesive bond line. The beam is then scanned (or rastered) across the substrate in a serial fashion to debond the entire surface, which leads to long debonding times and low wafer throughput.

Though thermomechanical debonding can be performed typically in a few minutes, it has other limitations that can reduce device yield. Backside processes for temporarily bonded device wafers often involve working temperatures higher than 200° C. or even 300° C. If polymeric adhesives either decompose or soften excessively at or near the working temperature, debonding may occur prematurely. Adhesives are normally selected to soften sufficiently at about 20° C. to about 50° C. above the working temperature of the device wafer. The high temperature required for debonding such adhesives imposes significant stresses on the bonded pair as a result of thermal expansion. At the same time, the high mechanical force utilized to move the device wafer away from the carrier wafer by a sliding, lifting, or twisting motion creates additional stress that can cause the device wafer to break or produce damage within the microscopic integrated circuitry of individual devices, which leads to device failure and yield loss.

Thermodecomposition debonding also tends to cause wafer breakage. Gases are produced when the polymeric adhesive is decomposed, and these gases can become trapped between the device wafer and the carrier wafer before the bulk of the adhesive has been removed. The accumulation of trapped gases can cause the thin device wafer to blister and crack or even rupture. Another problem with thermodecomposition debonding is that polymer decomposition is often accompanied by the formation of intractable, carbonized residues that cannot be removed from the device wafer by conventional cleaning procedures.

To solve problems with debonding wafers, U.S. Patent Application Publication 2011/0308739 discloses forming a strong bond only at the outer perimeter of the wafers. The edge bonds are chemically, mechanically, acoustically, or thermally softened, dissolved, or disrupted. To prevent strong bonding at the interior of the contact surface, a polymeric fill material is coated onto the carrier wafer before attaching an adhesive at the perimeter. Because the polymeric fill material does not form strong bonds to the wafers, the wafers may be separated easily by removing the adhesive.

DETAILED DESCRIPTION

Figure 1A:
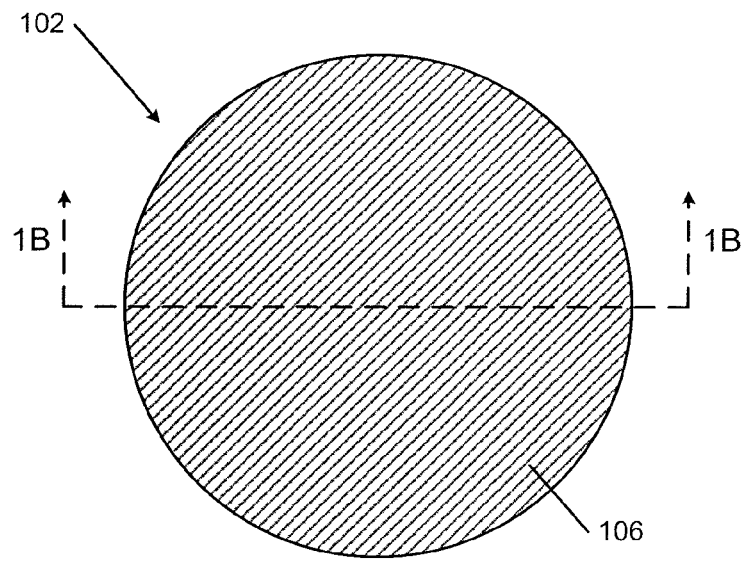
FIGS. 1A, 2A, 3A, 4A, and 5A are top views of a semiconductor structure according to an embodiment of the present disclosure at various stages of processing.

In some embodiments disclosed herein, methods of processing a semiconductor device are described, as are compositions for attaching a carrier substrate to a device wafer substrate. The methods include exposing a carrier substrate to a silane material to form a coating over the carrier substrate. The coating may exhibit a lower affinity for an adhesive material than the carrier substrate itself. A portion of the coating may be removed, such as near an edge of the carrier substrate. An adhesive material may then be applied to the carrier substrate to bond a wafer substrate to the carrier substrate. The bond may be relatively weak between the portion of the carrier substrate having the coating and the adhesive material, such that subsequent separation of the wafer substrate from the carrier substrate (e.g., after performing other operations on the device wafer substrate) may be performed with less stress on the device wafer substrate (e.g., by subjecting the wafer substrate to weaker forces, a lower temperature, etc.).

As used herein, the terms "wafer substrate" and "device wafer substrate" mean and include a base material or construction upon which components, such as those of memory cells and peripheral circuitry, as well as logic, are formed. The wafer substrate may be a substrate wholly of a semiconductor material, a base semiconductor material on a supporting structure, or a semiconductor substrate having one or more materials, structures, or regions formed thereon. The wafer substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, wherein x is, for example, a mole fraction between 0.2 and 0.8), germanium (Ge), gallium arsenide (GaAs), gallium nitride (GaN), or indium phosphide (InP), among others. Furthermore, when reference is made to a "wafer substrate" in the following description, previous process stages may have been utilized to form materials, regions, or junctions, as well as connective elements such as lines, plugs, and contacts, in the base semiconductor structure or foundation, such components comprising, in combination, integrated circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, flipped, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

Embodiments are described herein with reference to the illustrations. The illustrations presented herein are not meant to be actual views of any particular material, component, structure, device, or system, but are merely idealized representations that are employed to describe embodiments of the present disclosure. Variations from the shapes of the illustrations as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims.

The following description provides specific details, such as material types and processing conditions, in order to provide a thorough description of embodiments of the disclosed compositions and methods. However, a person of ordinary skill in the art will understand that the embodiments of the compositions and methods may be practiced without employing these specific details. Indeed, the embodiments of the compositions and methods may be practiced in conjunction with conventional semiconductor fabrication techniques.

The fabrication processes described herein do not form a complete process flow for processing semiconductor devices. Preceding, intermediary, and final process stages are known to those of ordinary skill in the art. Accordingly, only the methods and semiconductor structures necessary to understand embodiments of the present devices and methods are described herein.

Unless the context indicates otherwise, the materials described herein may be formed by any conventional technique including, but not limited to, dip coating, spin coating, spray coating, blanket coating, chemical vapor deposition ("CVD"), plasma-enhanced CVD, atomic layer deposition ("ALD"), plasma-enhanced ALD, or physical vapor deposition ("PVD"). Alternatively, the materials may be grown in situ, unless the context otherwise indicates. Depending on the specific material to be formed, the technique for applying, depositing, growing, or otherwise forming the material may be selected by a person of ordinary skill in the art.

Disclosed are methods of processing semiconductor devices. The methods include exposing a carrier substrate to a silane material to form a coating over a surface of the carrier substrate, removing a portion of the coating from the surface at least adjacent a periphery of the carrier substrate without removing a remainder of the coating, adhesively bonding another substrate to the carrier substrate over the surface, and separating the another substrate from the carrier substrate. The silane material includes a compound having a structure selected from the group consisting of $(XO)_3Si(CH_2)_nY$, $(XO)_2Si((CH_2)_nY)_2$, and $(XO)_3Si(CH_2)_nY(CH_2)_nSi(XO)_3$, wherein XO is a hydrolyzable alkoxy group, Y is an organofunctional group, and n is a nonnegative integer.

Reference will now be made to the drawings, where like numerals refer to like components throughout. The drawings are not necessarily to scale.

Figure 1B:
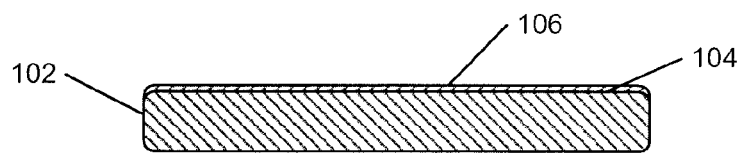
FIGS. 1B, 2B, 3B, 4B, and 5B are cross-sectional views of the semiconductor structures shown in FIGS. 1A, 2A, 3A, 4A, and 5A, respectively.

FIGS. 1A and 1B illustrate a simplified schematic of a carrier substrate 102, and a cross-sectional view of the carrier substrate 102 through section line 1B-1B, respectively. The carrier substrate 102 has a surface 104 over which a wafer substrate may subsequently be secured, as described in further detail below. A coating 106 may be formed on the carrier substrate 102 by exposing the carrier substrate 102 to a coat-forming composition. One or more components of the coat-forming composition, e.g., the coating material, may be reactive with one or more components of the carrier substrate 102. The term "coating composition," as used herein, refers to the composition of the resulting, formed coating 106. The coat-forming composition may not necessarily be identical to the coating composition due to, e.g., chemical reactions between the coat-forming composition and the carrier substrate 102 during formation of the coating 106, or chemical reactions of the coat-forming composition during cure.

The coat-forming composition may be formulated to form a coating on the otherwise exposed surfaces of some or all of the carrier substrate 102, e.g., on essentially all of a major surface of the carrier substrate 102.

The coat-forming composition may include, for example and without limitation, a silane material. As used herein, the terms "silane" and "silane material" mean and include a chemical compound including silicon and at least one other element, e.g., carbon, hydrogen, nitrogen, sulfur, or a combination thereof. Silane materials may be formulated as non-functional silanes or as functional silanes.

As used herein, the term "non-functional silane" means a silane material having an alkoxy group formulated to react with a metal (e.g., in the carrier substrate 102) but lacking a functional group reactive with a nonmetallic material. Non-functional silanes may have stable functional groups connected to a silicon atom, such as phenyl groups, tolyl groups, alkyl groups, pentafluorophenyl groups, etc. Thus, non-functional silanes form a coating over the carrier substrate 102 that is relatively inert to conventional processing operations. Examples of non-functional silane materials include, but are not limited to, silane compounds including the formula —Si—$(OC_2H_5)_x$, wherein x is an integer, and including either a methoxy or an ethoxy group bonded to the Si atom. The methoxy or ethoxy group is hydrolyzable to form a silanol (i.e., a —Si—OH), with an alcohol (e.g., methanol or ethanol) formed as a by-product. Examples of such non-functional silanes include, without limitation, the materials listed and shown in Table 1, which table is not exhaustive.

TABLE 1

Examples of Non-Functional Silanes and Chemical Structures

| Non-functional Silane | Chemical Structure |
|---|---|
| p-tolytrimethoxy-silane | |
| p-tolyltriethoxy-silane | |
| di(p-tolyl)di-methoxysilane | |

TABLE 1-continued

Examples of Non-Functional Silanes and Chemical Structures

| Non-functional Silane | Chemical Structure |
|---|---|
| pentafluorophenyl-triethoxysilane | [structure] |
| 1,2-bis-[triethoxysilyl]ethane (BTSE) | [structure] |
| bis-trimethoxysilyl-ethylbenzene | [structure] |
| bis-[trimethoxysilyl]octane (BTSO) | [structure] |
| bis-[trimethoxysilyl]decane (BTSD) | [structure] |

As used herein, the term "functional silane" means a silane material formulated to react with the carrier substrate 102 and having a functional group reactive with a nonmetallic material of the carrier substrate 102. Functional silanes may have reactive functional groups directly or indirectly connected to a silicon atom, such as mercapto groups, sulfur groups, amine groups, epoxy groups, halogen groups, alkene groups, etc. Thus, functional silanes form a coating over the carrier substrate 102 that reacts in some conventional processing operations. For example, without limitation, a functional silane material may be an organofunctional silane with one or more of the organofunctional groups or chemical structures in Table 2, which table is not exhaustive.

TABLE 2

Examples of Organofunctional Groups and Chemical Structures

| Organofunctional Group | Example Chemical Structure |
|---|---|
| Vinyl | $H_2C{=}CHSi(OCH_3)_3$ |
| Chloropropyl | $Cl(CH_2)_3Si(OCH_3)_3$ |
| Epoxy | $CH_2CHCH_2O(CH_2)_2CH_2Si(OCH_3)_3$ (with epoxide ring) |

TABLE 2-continued

Examples of Organofunctional Groups and Chemical Structures

| Organofunctional Group | Example Chemical Structure |
| --- | --- |
| Methacrylate | $H_2C\!\!=\!\!\overset{CH_3}{\underset{\phantom{|}}{C}}\!\!-\!\!COO(CH_2)_3Si(OCH_3)_3$ |
| Primary Amine | $H_2N(CH_2)_3Si(OCH_3)_3$ |
| Diamine | $H_2N(CH_2)_2NH(CH_2)_3Si(OCH_3)_3$ |
| Mercapto | $HS(CH_2)_3Si(OCH_3)_3$ |

Examples of functional and non-functional silanes include, but are not limited to, a hybrid organic-inorganic compound with the formula $(XO)_3Si(CH_2)_nY$, $(XO)_2Si((CH_2)_nY)_2$, or $(XO)_3Si(CH_2)_nY(CH_2)_nSi(XO)_3$, wherein XO represents a hydrolyzable alkoxy group (e.g., methoxy, ethoxy), n represents an integer, and Y represents an organofunctional group, such as, for example and without limitation, an alkyl, tolyl, phenyl, amino, sulfur, carboxyl, or thiol group. The organofunctional groups Y may include various substitutions, such as halogens, hydroxyl groups, etc. Whether such materials are functional or non-functional depends on the characteristics of the organofunctional group Y. For example, if the organofunctional group Y includes fluorine-terminated groups (e.g., pentafluorophenyltriethoxysilane, as shown in Table 1), the material may be non-functional because the fluorine does not tend to react with other materials.

When a silane material, either functional or non-functional, is hydrolyzed in water, or, alternatively, in an alcohol and water mixture, silanol groups (i.e., Si—OH groups) may form. The silanol groups of the hydrolyzed coat-forming composition may be reactive with hydroxyl groups, such as those on the surface of a metal or other element that has been exposed to oxygen and moisture. That is, exposure of a metal or other element to oxygen may form oxides on the surface of the metal or other element. Subsequent exposure of the formed oxides to moisture may form M-OH bonds, wherein M represents a metal (for example, and without limitation, Cu, Ni, Sn, Al, Ag) or Si. Thus, metal or silicon components of the carrier substrate 102 may include hydroxyl bonds on their surfaces. Exposure of such hydroxyl bonds to silanol groups of a hydrolyzed silane material may lead to reaction, e.g., a condensation reaction, of the hydroxyl groups with the silanol groups, forming M-O—Si bonds, wherein M represents a metal or Si—Si. Accordingly, exposure of the carrier substrate 102 to a coat-forming composition including a silane material, water, and, optionally, an alcohol, may enable reaction between the coat-forming composition and the surface of the carrier substrate 102 to form a coating 106 on the metallic component wherein the coating 106 has a coating composition including M-O—Si bonds, also referred to herein as "metal-oxygen-silicon bonds" or Si—O—Si bonds.

Thus, some methods of processing semiconductor devices include forming a polymeric material comprising Si—O—Si over a surface of a substrate, removing a portion of the polymeric material at least adjacent a periphery of the surface of the substrate without removing a remainder of the polymeric material, adhesively bonding another substrate to the substrate over the surface, and separating the another substrate from the substrate.

Both functional and non-functional silane materials may be formulated to react with the carrier substrate 102, as described above.

Functional silane materials may be formulated to be additionally reactive. For example, in embodiments in which the silane material of the coat-forming composition includes an alkoxy (e.g., methoxy, ethoxy, etc.) group, the alkoxy groups of the silane material are hydrolyzable to form silanols that may react with the hydroxyl groups of the carrier substrate 102. For example, and without limitation, the alkoxy groups of the silane material in the coat-forming composition may be hydrolyzed to silanols as illustrated in the following example reactions:

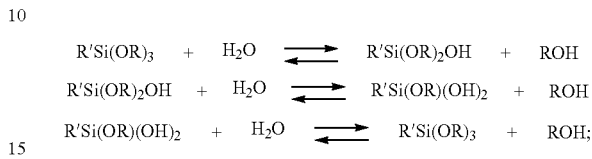

wherein R' and R represent hydrocarbons. The silanols may then react with the hydroxides of the carrier substrate 102 to form M-O—Si bonds (metal-oxygen-silicon bonds) or Si—O—Si bonds and water as illustrated in the following reaction, wherein the dashed line illustrates a surface of the carrier substrate 102:

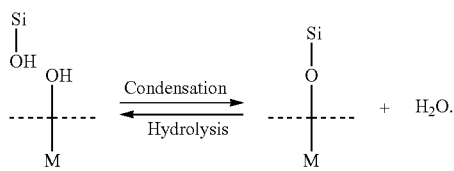

Examples of such alkoxy-including functional silane materials include, but are not limited to, monosilanes such as y-aminopropyltriethyoxysilanes (y-APS), y-methacryloxypropyltriethoxysilanes (y-MPS), or y-glycidoxypropyltrimethoxysilanes (y-GPS), and bis-silanes such as bis-[trimethoxysilylpropyl]amine (available under the name SILQUEST® A-1170 Silane from Momentive Performance Materials Inc., of Columbus, Ohio), or bis[3-triethoxysilylpropyl]tetrasulfide (available under the name SILQUEST® A-1289 Silane from Momentive Performance Materials Inc.).

The silane material of the coat-forming composition may alternatively or additionally be formulated to include other functional groups. For example, and without limitation, a functional silane material including sulfur functional groups may react with metal within the carrier substrate 102, forming M-S bonds, also referred to herein as "metal-sulfur bonds." For example, a sulfur group of a sulfur-based functional silane material may react with copper within the carrier substrate 102 to form Cu—S bonds ("copper-sulfur bonds"). Therefore, such coating 106 formed may have a coating composition including M-S bonds.

Silanol groups of a silane material, whether functional or non-functional, may also condense with one another during formation of the coating 106, forming Si—O—Si bonds ("silicon-oxygen-silicon bonds"). The formation of the Si—O—Si bonds may increase the density and the viscosity of the coating material as the coating 106 forms. Therefore, the formed coating 106 may have a coating composition including Si—O—Si bonds.

The coating 106 may be formed by exposing surfaces of one or more materials of the carrier substrate 102 to the coat-forming composition. The surfaces of the carrier substrate 102 may be exposed to a coating solution that includes the coat-forming composition, and the surfaces of the carrier substrate 102 may be dip coated, spin coated, spray coated, or otherwise covered with the coating solution.

Such a coating solution may include the coat-forming composition, a solvent, and, optionally, water. The solvent used in the coating solution may include a water-based solvent, a solvent miscible in water, and/or an organic solvent. For example, an organic solvent such as an alcohol (e.g., methanol, ethanol), in which the coat-forming composition is miscible, may be used to form the coating solution.

The solvent used in the coating solution may be selected such that the coating solution is formulated to reduce or prevent gelling of the coat-forming composition within the coating solution. As used herein, the term "gelling" means and includes thickening of the coating solution, increasing viscosity of the coating solution, and decreasing flowability of the coating solution prior to exposure of the carrier substrate 102 to the coating solution. For example, use of an alcohol as the solvent may prevent gelling of the silane material and maintain flowability of the coating solution during application thereof on the carrier substrate 102.

In some embodiments, the coat-forming composition may further include water (e.g., deionized water) to facilitate hydrolysis of the silane material to form the aforementioned reactive silanols. Water in the coating solution may also facilitate formation of oxide and hydroxyl groups on the carrier substrate 102 when the carrier substrate 102 is exposed to the coating solution. In other embodiments, the coating solution may be formed by mixing the coat-forming composition with the solvent in the absence of water. Water may then be introduced to the coating solution before the coating solution is applied to the surfaces of the carrier substrate 102. In still other embodiments, the surfaces of the carrier substrate 102 may be first exposed to water and then exposed to the other components (e.g., the coat-forming composition and solvent) of the coating solution.

The coating solution may be formed by adding the coat-forming composition including the silane material to the solvent (e.g., alcohol), and then adding water (e.g., deionized water). During and following addition of the components to the coating solution, the solution may be stirred to inhibit gelling of the silane material.

The coating solution may be formulated to exhibit a pH in the range of from about 4 to about 9 prior to application of the coating solution on the carrier substrate 102, which pH range may reduce or prevent gelling of the coat-forming composition (e.g., silane material). A coating solution with a pH lower than about 3 or a pH greater than about 10, on the other hand, may facilitate gelling of the silane material before exposure of the carrier substrate 102 to the coating solution. In some embodiments, an acid or base may be added to the coating solution to maintain the pH in a selected range. For example, acetic acid may be added to the coating solution.

The coating solution may include from about 1% by volume to about 20% by volume of the coat-forming composition including the silane material, based on the total volume of the coating solution. For example, and without limitation, the coating solution may include from about 5% by volume to about 10% by volume of the coat-forming composition, from about 80% by volume to about 90% by volume ethanol or other alcohol-based solvent, and from about 5% by volume to about 10% by volume deionized water.

The average thickness of the coating 106 may be dependent upon the concentration of the silane material in the coating solution used to form the coating 106. For example, a coating solution with a higher concentration of silane material, relative to a solvent and, if present, other components of the coating solution, may result in a thicker coating 106 compared to a coating solution with a lower concentration of silane material. However, coating solutions including high concentrations of silane material may have a higher propensity to gel than those with lower concentrations of silane material. Therefore, the concentration of the silane material in the coating solution used to form the coating 106 may be tailored to achieve a coating 106 of a selected average thickness without excessive gelling. For example, and without limitation, a coating solution including about 5% by volume silane material, about 90% by volume ethanol or other alcohol-based solvent, and about 5% by volume deionized water may be used to produce a coating 106 with a thickness from about 250 nanometers to about 500 nanometers. As another example, a coating solution including about 2% by volume of silane material may be used to produce a coating 106 with an average thickness of about 80 nanometers to about 200 nanometers.

Application of a coating solution may be self-limiting such that one application of the coating solution covers the exposed surfaces of the carrier substrate 102 to saturation. However, in some embodiments, multiple applications of the coating solution may be performed to form a thicker coating. Exposure of the carrier substrate 102 to the coating solution may be accomplished within a time frame of from about 30 seconds to about 1 minute, or longer if desired.

The coating solution may optionally include another material formulated to interact with the silane material, such as to increase the solubility, reduce or prevent gelling, or increase the hydrophobicity of the resulting coating 106. For example, other materials that may be present in the coating solution include a tetraethyl orthosilicate (TEOS) of the formula Si—$(OC_2H_5)_4$, colloidal alumina, etc.

After exposure of the carrier substrate 102 to the coat-forming composition, either by way of direct exposure to the coat-forming composition or to a coating solution including the coat-forming composition, the coat-forming composition may be cured. The curing conditions may depend on the silane material used as the coat-forming composition. By way of example, the coating material may be cured at about 125° C. for about one hour to foini the coating 106. Curing the coat-forming composition may encourage reaction and bonding between the silane material and the carrier substrate 102. The cure conditions may affect the properties of the coating 106, such as the density.

The resulting coating 106 may be hydrophobic, such that water tends to be repelled from the surface 104 of the carrier substrate 102. For example, the coating 106 may exhibit a contact angle with water of greater than about 60°, greater than about 70°, or greater than about 80°. In some embodiments, the coating 106 may exhibit a contact angle with water from about 90° to about 100°. In other embodiments, the coating 106 may be superhydrophobic, exhibiting a contact angle with water greater than about 90° (e.g., about 125° or greater). As a point of reference, hydrophilic (wettable) surfaces generally have contact angles with water of about 35° or less.

Figure 2A:
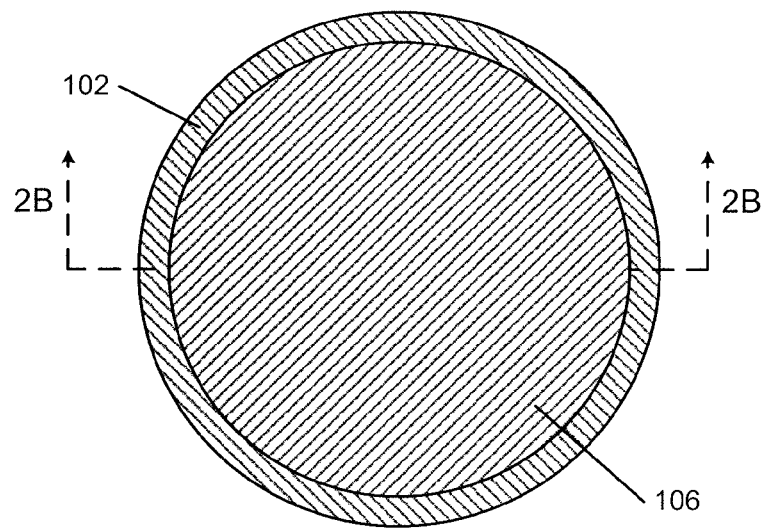
Figure 2B:
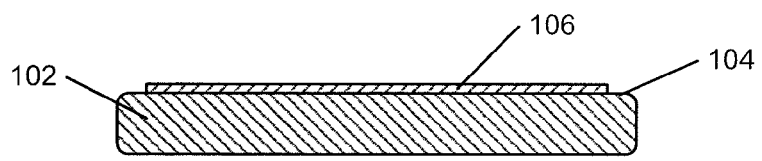

A portion of the coating 106 may be removed so that an adhesive will adhere to the carrier substrate 102. FIGS. 2A and 2B, illustrate a simplified schematic of the carrier substrate 102 after a portion of the coating 106 has been removed, and a cross-sectional view of the carrier substrate 102 through section line 2B-2B, respectively. As shown in FIGS. 2A and 2B, the coating 106 may cover less than the entire surface 104 of the carrier substrate 102. For example, the coating 106 may be removed near an edge (e.g., a periphery) of the carrier substrate 102. The process of removing a portion of the coating 106 may be referred to as "edge-bead removal" if the portion of the coating 106 is removed around a perimeter of the surface 104 of the carrier substrate 102. The portion of the coating 106 may be removed, for example, by exposing a portion of the carrier substrate 102 to a solvent formulated to dissolve the coating 106. For example, the portion of the coating 106 may be removed by exposure to isopropanol, ethanol, methanol, acetone, etc. Alternatively, a portion of the coat-forming composition may be removed before the coat-forming composition is cured to form the coating 106. Portions of the coating 106 or of the coat-forming composition may, optionally, be selectively removed in addition to a portion near the periphery of the surface 104 of the carrier substrate 102.

Figure 3A:
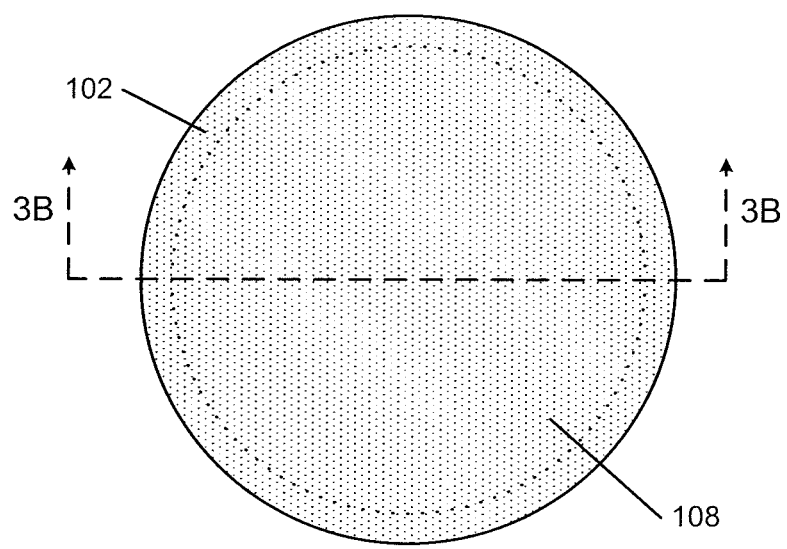
Figure 3B:
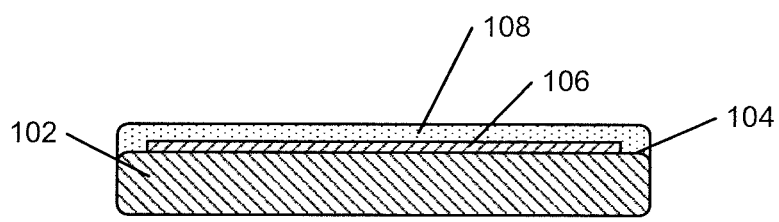

After the portion of the coating 106 has been removed from the carrier substrate 102, an adhesive 108 may be applied over the carrier substrate 102 and the coating 106, as shown in FIGS. 3A and 3B. FIG. 3A is a simplified schematic of the carrier substrate 102 after the adhesive 108 has been applied, and FIG. 3B is a cross-sectional view of the carrier substrate 102 through section line 3B-3B. The adhesive 108 may be a material capable of forming a strong adhesive bond with the carrier substrate 102 and a weaker bond with the coating 106. The adhesive 108 may exhibit an adhesion strength to the carrier substrate 102 of greater than about 50 psig, such as from about 80 psig to about 250 psig, or from about 100 psig to about 150 psig. The adhesive 108 may be selected to be thermally and chemically stable under the conditions to be used for backside processing. For example, the adhesive 108 may be selected to be thermally and chemically stable at temperatures of from about 150° C. to about 350° C., or from about 200° C. to about 300° C.

In some embodiments, the adhesive 108 may include commercially available temporary wafer-bonding compositions such as the WAFERBOND® materials (available from Brewer Science, Inc., of Rolla, Mo.) and ZONEBOND® materials (available from Brewer Science, Inc.), commercially available photoresist compositions, or other resins and polymers. For example, the adhesive 108 may include a high-solids, UV-curable resin system such as a reactive epoxy or acrylic. In other embodiments, the adhesive 108 may include a thermosetting resin system that cures or crosslinks upon heating (e.g., two-part epoxy and silicone adhesives, cyclic olefin polymers and copolymers with theimal catalyst initiators, and CYCLOTENE®, available from Dow Chemical Company, of Midland, Mich.). In some embodiments, the adhesive 108 may include ZONEBOND® 5150 (available from Brewer Science, Inc.). The adhesive 108 may also include thermoplastic acrylic, styrenic, vinyl halide (non-fluoro-containing), and vinyl ester polymers and copolymers along with polyamides, polyimides, polysulfones, polyethersulfones, and polyurethanes applied from a melt or as solution coatings that are baked after application to dry. In some embodiments, the adhesive 108 may include cyclic olefins, polyolefin rubbers (e.g., polyisobutylene), or hydrocarbon-based tackifier resins. If the adhesive 108 includes a thermosetting material, a crosslinking agent and, optionally, a catalyst, is added to the thermosetting material to induce crosslinking.

Figure 4A:
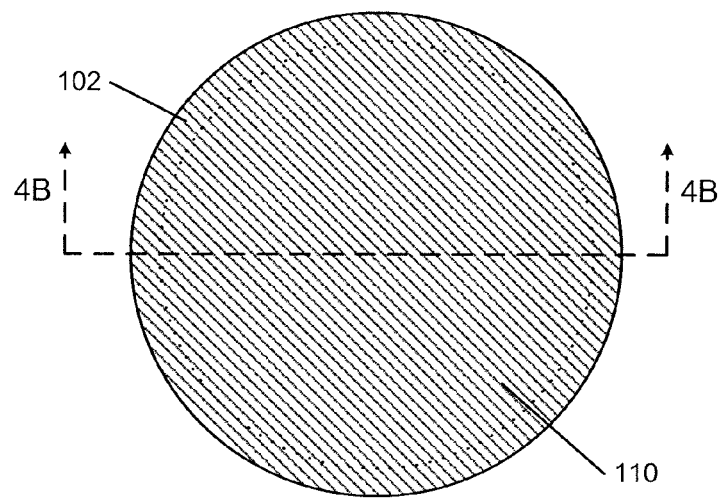
Figure 4B:
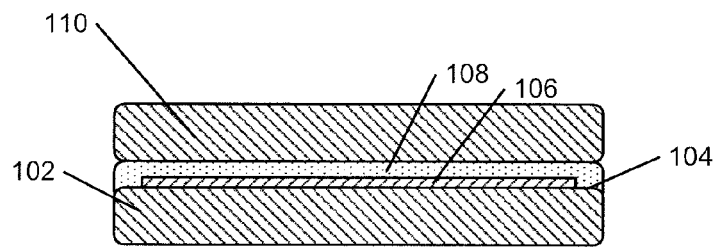

Also disclosed herein are structures including a polymeric material comprising Si—O—Si disposed over a first substrate surface, an adhesive material disposed over the first substrate surface and at least a portion of the polymeric material, and a second substrate disposed over the adhesive material. For example, a wafer substrate 110 may be attached to the adhesive 108, as shown in FIGS. 4A and 4B. FIG. 4A is a simplified schematic of the carrier substrate 102 with the wafer substrate 110 attached, and FIG. 4B is a cross-sectional view of the assembly through section line 4B-4B. In some embodiments, the adhesive 108 may be applied to the wafer substrate 110 before the wafer substrate 110 is attached to the carrier substrate 102 (instead of or in addition to applying the adhesive 108 to the carrier substrate 102). After attachment to the carrier substrate 102, the wafer substrate 110 may be subjected to backside processing by methods known in the art for processing semiconductor substrates. For example, conventional processes may be used to form semiconductor structures such as transistors, capacitors, contacts, traces, lines, vias, interconnects, etc.

The backside processing may include thinning of the wafer substrate 110 by back-grinding or other process. This processing and thinning forms the wafer substrate 110 into what is referred to in the art as a "thinned" wafer. The thinned wafer may be singulated into a number of semiconductor dice, each die bearing a number of passivated conductive elements on a major surface thereof. Electrically conductive vias, if present, extend through the thickness of the die singulated from the thinned wafer. A die may be brought into proximity with another die or other substrate. The another die or other substrate may support landing pads with which conductive elements may be aligned.

Figure 5A:
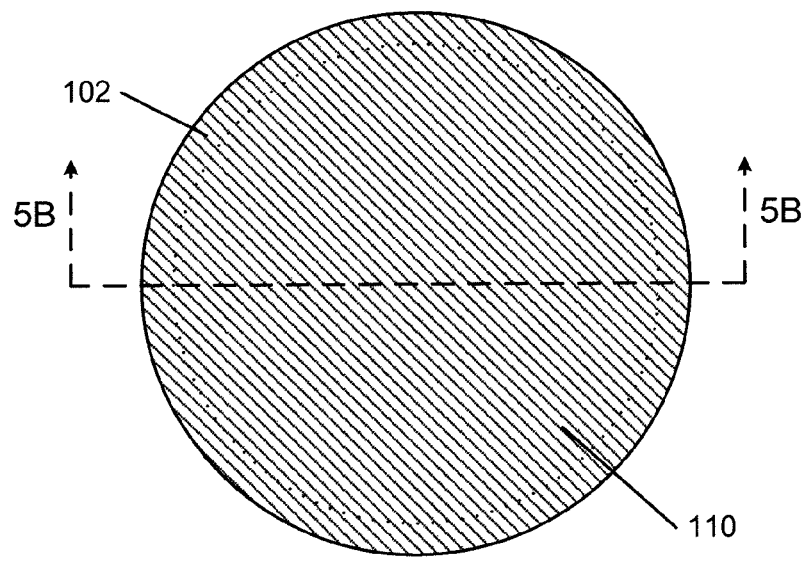
Figure 5B:
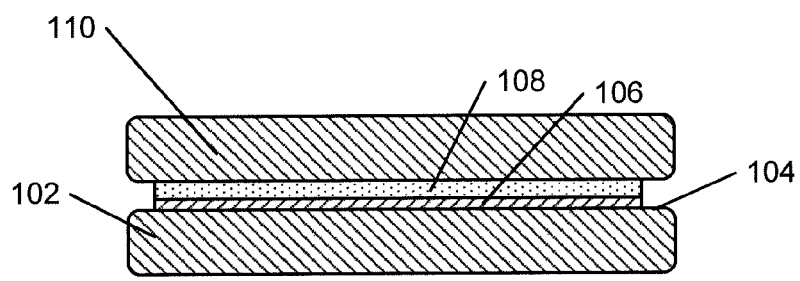

The wafer substrate 110 may be removed from the carrier substrate 102 after backside processing to form semiconductor structures. FIG. 5A is a simplified schematic of the carrier substrate 102 and the wafer substrate 110 after removal of a portion of the adhesive 108, and FIG. 5B is a cross-sectional view of the assembly through section line 5B-5B. As shown in FIGS. 5A and 5B, a portion of the adhesive 108 may be removed such that no adhesive remains attached directly to the carrier substrate 102. For example, a portion of the adhesive 108 near the edges of the carrier substrate 102 may be removed by chemical means (e.g., with a solvent), photodecomposition, thermomechanical means, or thermodecomposition. After removal of the portion of the adhesive 108, the wafer substrate 110 may be easily removed from the carrier substrate 102 with little force or stress. That is, the bond between the adhesive 108 and the coating 106 may be much weaker than the bond between the adhesive 108 and the carrier substrate 102. Thus, once the bonds between the adhesive 108 and the carrier substrate 102 are removed, the wafer substrate 110 may be removed without harsh treatments (e.g., large stresses, high temperatures, solvents, etc.). Such may prevent damage to the features formed on or in the wafer substrate 110. In some embodiments, the portion of the adhesive 108 may not be removed, but may be weakened to allow the bonds between the adhesive 108 and the carrier substrate 102 to be easily broken. After removal of the adhesive 108 from the carrier substrate 102, the adhesive 108 may be removed from the wafer substrate 110 by conventional means.

Figure 6:
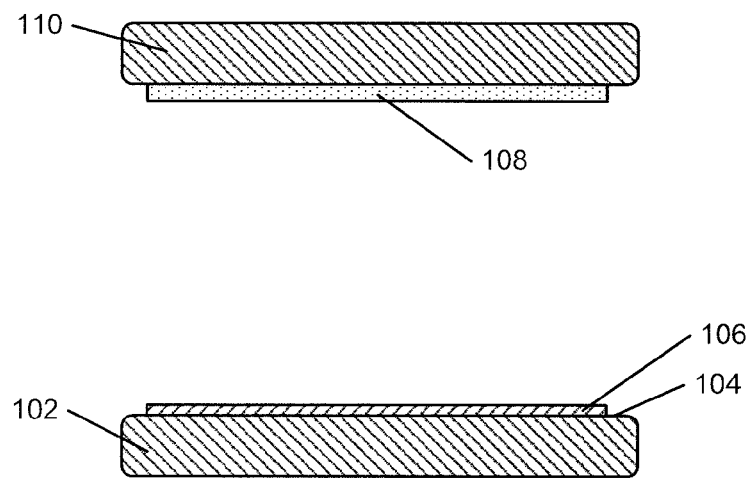
FIG. 6 is a cross-sectional view of a semiconductor structure according to an embodiment of the present disclosure and a carrier wafer after separation.

FIG. 6 shows a simplified cross-sectional view of the carrier substrate 102 and the wafer substrate 110 after separation. As shown in FIG. 6, the adhesive 108 may remain attached to the wafer substrate 110, and may be substantially released from the carrier substrate 102. The adhesive 108 may be removed from the wafer substrate 110 as known in the art, such as by dissolving in an organic solvent, dry etching, or grinding. Removal of the adhesive 108 from the wafer substrate 110 and/or the carrier substrate 102 may expose fresh surfaces for use in subsequent processes. The coating 106 may remain on the carrier substrate 102 unless and until the coating 106 is exposed to a solvent or otherwise treated to remove the coating 106 from the carrier substrate 102. Thus, the carrier substrate 102 may be used in processing subsequent wafer substrates 110 without repeating the application, edge-bead removal, and curing of the coating 106.

While the disclosed device structures and methods are susceptible to various modifications and alternative forms in implementation thereof, specific embodiments have been shown by way of example in the drawings and have been described in detail herein. However, it should be understood that the present disclosure is not intended to be limited to the particular forms disclosed. Rather, the present invention encompasses all modifications, combinations, equivalents, variations, and alternatives falling within the scope of the following appended claims and their legal equivalents.

What is claimed is:

1. A method of processing a semiconductor device, comprising:
    exposing a carrier substrate to a silane material to form a coating over a surface of the carrier substrate, the silane material comprising a compound having a structure selected from the group consisting of $(XO)_3Si(CH_2)_nY$, $(XO)_2Si((CH_2)_nY)_2$, and $(XO)_3Si(CH_2)_nY(CH_2)_nSi(XO)_3$, wherein XO is a hydrolyzable alkoxy group, Y is an organofunctional group, and n is a nonnegative integer;
    removing a portion of the coating from the surface at least adjacent a periphery of the carrier substrate without removing a remainder of the coating;
    adhesively bonding another substrate to the carrier substrate over the surface; and
    separating the another substrate from the carrier substrate.

2. The method of claim 1, further comprising selecting XO from the group consisting of methoxy and ethoxy groups.

3. The method of claim 1, wherein Y comprises at least one aromatic ring.

4. The method of claim 1, further comprising at least partially curing the coating before adhesively bonding the another substrate to the carrier substrate.

5. The method of claim 4, wherein at least partially curing the coating comprises curing the coating before removing the portion of the coating adjacent the periphery of the carrier substrate.

6. The method of claim 1, wherein removing a portion of the coating from the surface at least adjacent a periphery of the carrier substrate comprises removing a portion of an at least partially cured coating.

7. The method of claim 1, wherein exposing a carrier substrate to a silane material to form a coating over a surface of the carrier substrate comprises forming a hydrophobic coating over a surface of the carrier substrate.

8. The method of claim 1, wherein removing a portion of the coating from the surface at least adjacent a periphery of the carrier substrate comprises exposing the carrier substrate to a solvent.

9. The method of claim 1, wherein adhesively bonding another substrate to the carrier substrate comprises applying an adhesive over the coating and over an uncoated portion of the carrier substrate.

10. The method of claim 1, wherein adhesively bonding another substrate to the carrier substrate comprises applying an adhesive over the another substrate before bonding the another substrate to the carrier substrate.

11. The method of claim 1, wherein the silane material comprises a material selected from the group consisting of 1,2-bis[triethoxysilyl]ethane, 1,2-bis[trimethoxysilyl]octane, and 1,2-bis[trimethoxysilyl]decane.

12. The method of claim 1, wherein exposing a carrier substrate to a silane material to form a coating over a surface of the carrier substrate comprises exposing the carrier substrate to a solution comprising the silane material.

13. The method of claim 12, wherein exposing the carrier substrate to a solution comprising the silane material comprises exposing the carrier substrate to a solution comprising the silane material and water.

14. The method of claim 12, wherein exposing the carrier substrate to a solution comprising the silane material comprises exposing the carrier substrate to a solution comprising the silane material and an organic solvent.

15. The method of claim 14, wherein exposing the carrier substrate to a solution comprising the silane material comprises exposing the carrier substrate to a solution comprising about five volume percent silane material, about five volume percent deionized water, and about ninety volume percent methanol or ethanol.

16. A method of processing a semiconductor device, comprising:
    forming a polymeric material comprising Si—O—Si over a substrate;
    removing a portion of the polymeric material at least adjacent a periphery of a surface of the substrate without removing a remainder of the polymeric material;
    adhesively bonding another substrate to the substrate over the surface; and
    separating the another substrate from the substrate.

17. The method of claim 16, wherein forming a polymeric material comprising Si—O—Si over a substrate comprises exposing the substrate to a silane material comprising a compound selected from the group consisting of $(XO)_3Si(CH_2)_nY$, $(XO)_2Si((CH_2)_nY)_2$, and $(XO)_3Si(CH_2)_nY(CH_2)_nSi(XO)_3$, wherein XO is a hydrolyzable alkoxy group, Y is an organofunctional group, and n is a nonnegative integer.

18. The method of claim 17, wherein forming a polymeric material comprising Si—O—Si over a substrate further comprises curing the silane material.

19. The method of claim 17, wherein exposing the substrate to a silane material comprises exposing the substrate to a material selected from the group consisting of 1,2-bis[triethoxysilyl]ethane, 1,2-bis[trimethoxysilyl]octane, and 1,2-bis[trimethoxysilyl]decane.

20. The method of claim 16, wherein forming a polymeric material comprising Si—O—Si over a substrate comprises forming a porous silane film.

21. The method of claim 16, further comprising forming an interfacial layer comprising Si—O—Si and M-O—Si, wherein M is a metal.

22. The method of claim 21, wherein adhesively bonding another substrate to the substrate comprises adhesively bonding the another substrate to the portion of the substrate substantially free of the polymeric material.

* * * * *